United States Patent
Chien et al.

(10) Patent No.: US 7,898,558 B2
(45) Date of Patent: Mar. 1, 2011

(54) GATE DRIVING CIRCUIT AND DRIVING CIRCUIT UNIT THEREOF

(75) Inventors: Chih-Yuan Chien, Hsin-Chu (TW); Yu-Ju Kuo, Hsin-Chu (TW); Wan-Jung Chen, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 903 days.

(21) Appl. No.: 11/774,812

(22) Filed: Jul. 9, 2007

(65) Prior Publication Data

US 2008/0143759 A1 Jun. 19, 2008

(30) Foreign Application Priority Data

Dec. 14, 2006 (TW) ............................... 95146930 A

(51) Int. Cl.
*G09G 5/02* (2006.01)
(52) U.S. Cl. .......................... 345/698; 345/92
(58) Field of Classification Search .......... 345/87–100, 345/204–215, 690–698
See application file for complete search history.

(56) References Cited

U.S. PATENT DOCUMENTS

| | | | |
|---|---|---|---|
| 5,222,082 A | 6/1993 | Plus | |
| 5,517,542 A | 5/1996 | Huq | |
| 7,023,410 B2 * | 4/2006 | Lee et al. | 345/87 |
| 7,050,036 B2 | 5/2006 | Kim et al. | |
| 7,369,111 B2 * | 5/2008 | Jeon et al. | 345/100 |
| 2005/0220262 A1 | 10/2005 | Moon | |
| 2006/0097981 A1 | 5/2006 | Park et al. | |

FOREIGN PATENT DOCUMENTS

| | | |
|---|---|---|
| CN | 1135625 | 11/1996 |
| CN | 1773338 | 5/2006 |

OTHER PUBLICATIONS

English language translation of abstract and pertinent parts of CN 1135625, Nov. 13, 1996.
English language translation of abstract and pertinent parts of CN 1773338, May 17, 2006.

* cited by examiner

*Primary Examiner*—Vijay Shankar
(74) *Attorney, Agent, or Firm*—Thomas, Kayden, Horstemeyer & Risley, LLP

(57) ABSTRACT

A driving circuit unit outputting a driving signal includes an input unit, an assistant output unit and an output unit. The input unit is coupled to an input node and receives a start signal to make the input node have a potential. The assistant output unit receives a first clock signal to increase the potential of the input node. The output unit receives a second clock signal to increase the potential of the input node and outputs the driving signal. A gate driving circuit is also disclosed.

35 Claims, 5 Drawing Sheets

GATE DRIVING CIRCUIT AND DRIVING CIRCUIT UNIT THEREOF

RELATED APPLICATIONS

This application claims priority to Taiwan Application Serial Number 95146930, filed Dec. 14, 2006, which is herein incorporated by reference.

BACKGROUND

1. Field of Invention

The present invention relates to a gate driving circuit and a driving circuit unit thereof. More particularly, the present invention relates to a gate driving circuit and a driving circuit unit thereof in a liquid crystal display.

2. Description of Related Art

In a conventional liquid crystal display, there is always an external gate driver used to drive scan lines of the liquid crystal display. However, the production cost is expensive when using the external gate driver. Therefore, lowering the production cost for the gate driver is very important.

In the prior art, a gate driving circuit fabricated on a glass substrate is used to output the gate driving signals to the scan lines, so as to replace the external gate driver used before and lower the production cost. FIG. 1 shows a conventional gate driving circuit. The gate driving circuit 100 includes driving circuit units 102, controlled with a power voltage VSS and clock signals CK and XCK which have opposite phases thereof, for sequentially outputting driving signals $SN_1 \ldots SN_N$ to the corresponding scan lines. However, when producing a large liquid crystal display, the loads of the scan lines increase accordingly. Therefore, due to the increasing loads, the driving signals would be distorted, so that the corresponding scan lines cannot be operated properly. Besides, transistors in the gate driving circuit also have to become relatively bigger, so as to output enough current to drive the scan lines, and the heat effect in the circuit is therefore more serious.

For the foregoing reasons, a gate driving circuit capable of improving the outputted driving signals and preventing the circuit from the heat effect problem is needed.

SUMMARY

It is therefore an aspect of the present invention to provide a gate driving circuit and a driving circuit unit thereof, so as to improve outputted driving signals and prevent the circuit from the heat effect problem.

In accordance with one embodiment of the present invention, a driving circuit unit is provided. The driving circuit unit, for outputting a driving signal, includes an input unit, an assistant output unit and an output unit. The input unit is coupled to an input node and receives a start signal to make the input node have a potential. The assistant output unit receives a first clock signal to increase the potential of the input node. The output unit receives a second clock signal to increase the potential of the input node and outputs the driving signal.

In accordance with another embodiment of the present invention, a gate driving circuit is provided. The gate driving circuit drives scan lines of a liquid crystal display and includes first circuit units and second circuit units. The first circuit units output first driving signals to the odd-numbered scan lines, and each of the first circuit units includes a first input unit, a first assistant output unit and a first output unit. The first input unit is coupled to a first input node and receives a first start signal to make the first input node have a first potential. The first assistant output unit receives a first clock signal to increase the first potential of the first input node. The first output unit receives a second clock signal to increase the first potential of the first input node and outputs the first driving signal as a next first start signal for a next first circuit unit of the first circuit units. The second circuit units output second driving signals to the even-numbered scan lines, and each of the second circuit units includes a second input unit, a second assistant output unit and a second output unit. The second input unit is coupled to a second input node and receives a second start signal to make the second input node have a second potential. The second assistant output unit receives a third clock signal to increase the second potential of the second input node. The second output unit receives a fourth clock signal to increase the second potential of the second input node and outputs the second driving signal as a next second start signal for a next second circuit unit of the second circuit units.

According to the embodiments of the present invention, the gate driving circuit and the driving circuit unit thereof can be used to improve outputted driving signals, output enough driving current and prevent the circuit from the heat effect problem.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Detailed illustrative embodiments of the present invention are disclosed herein. However, specific details disclosed herein are merely representative for purposes of describing exemplary embodiments of the present invention. This invention may, however, be embodied in many alternate forms and should not be construed as limited to the embodiments set forth herein.

Figure 1:
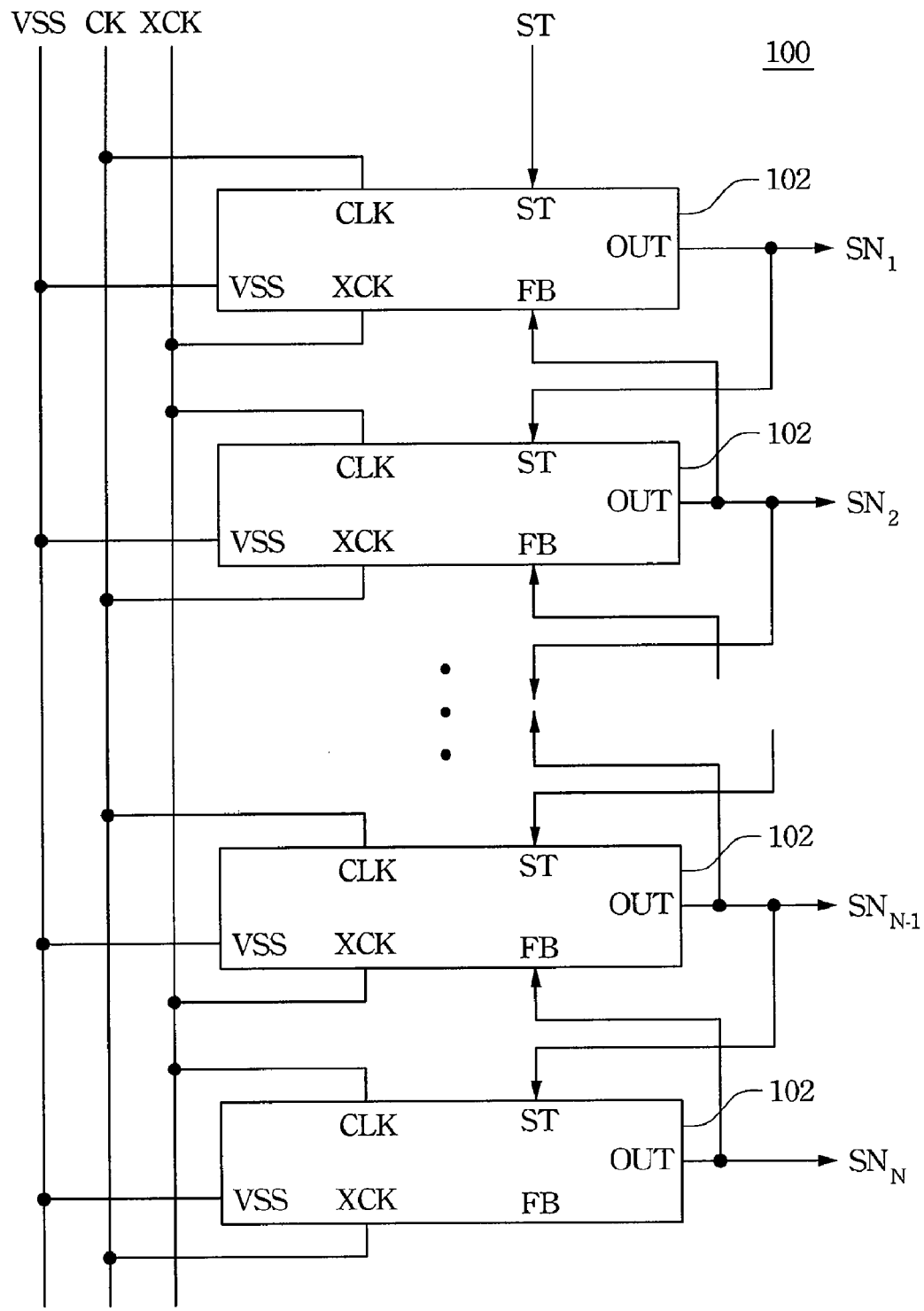
FIG. 1 shows a conventional gate driving circuit.
Figure 2:
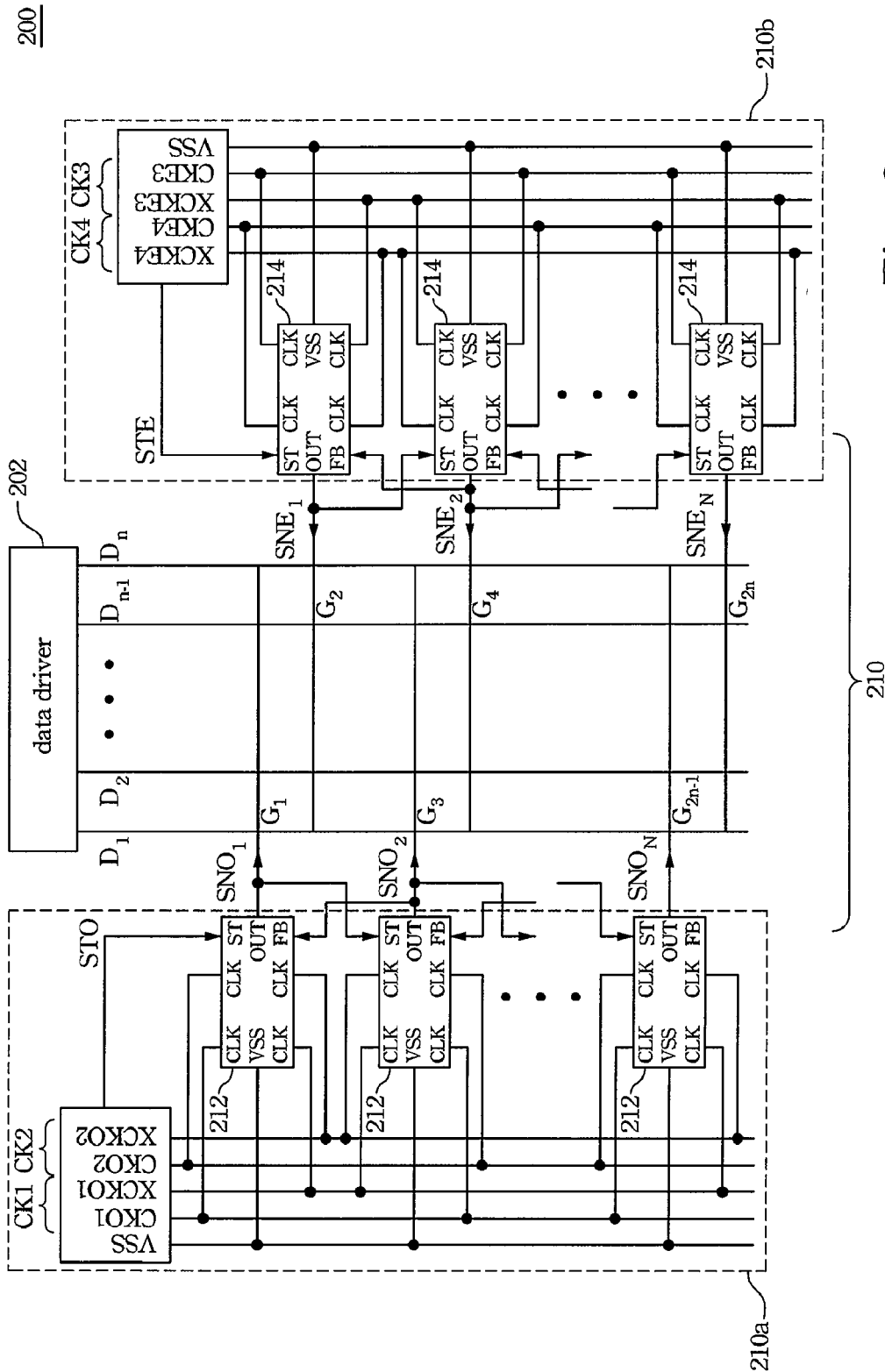
FIG. 2 shows a liquid crystal display panel according to one embodiment of the present invention.

FIG. 2 shows a liquid crystal display panel according to one embodiment of the present invention. The liquid crystal display panel 200 includes data lines $D_1 \ldots D_n$, scan lines $G_1 \ldots G_{2n}$, a data driver 202 and a gate driving circuit 210, and the gate driving circuit 210 drives the scan lines $G_1 \ldots G_{2n}$. The gate driving circuit 210 is separated into a first gate driving circuit 210a and a second gate driving circuit 210b, and the first gate driving circuit 210a includes first circuit units 212 and the second gate driving circuit 210b includes second circuit units 214. The first circuit units 212 is coupled to the odd-numbered scan lines $G_1, G_3, \ldots, G_{2n-1}$, respectively, and output first driving signals $SNO_1 \ldots SNO_N$ to the odd-numbered scan lines $G_1, G_3, \ldots, G_{2n-1}$. The second circuit units 214 is coupled to the even-numbered scan lines $G_2, G_4, \ldots, G_{2n}$, respectively, and output second driving signals $SNE_1 \ldots SNE_N$ to the even-numbered scan lines $G_2, G_4, \ldots, G_{2n}$.

For the first gate driving circuit 210a, each of the first circuit units 212 has the same structure. Taking an Nth first circuit unit 212 for example, the Nth first circuit unit 212 is coupled to a power voltage VSS and receives a first clock signal CK1 and a second clock signal CK2 to output the present, i.e. Nth, first driving signal $SNO_N$ to the scan line. The first clock signal CK1 further includes a first positive-phase clock signal CKO1 and a first negative-phase clock signal XCKO1, and the second clock signal CK2 further includes a second positive-phase clock signal CKO2 and a second negative-phase clock signal XCKO2. Further, the first driving signal $SNO_N$ is also transmitted to the next, i.e. (N+1)th, first circuit unit 212 to drive the next first circuit unit 212, and transmitted to the previous, i.e. (N−1)th, first circuit unit 212 to release the accumulated charges of the previous first circuit unit 212.

For the second gate driving circuit 210b, each of the second circuit units 214 has the same structure as well. Taking an Nth second circuit unit 214 for example, the Nth second circuit unit 214 is coupled to the power voltage VSS and receives a third clock signal CK3 and a fourth clock signal CK4 to output the present, i.e. Nth, second driving signal $SNE_N$ to the scan line. The third clock signal CK3 further includes a third positive-phase clock signal CKE3 and a third negative-phase clock signal XCKE3, and the fourth clock signal CK4 further includes a fourth positive-phase clock signal CKE4 and a fourth negative-phase clock signal XCKE4. Further, the second driving signal $SNE_N$ is also transmitted to the next, i.e. (N+1)th, second circuit unit 214 to drive the next second circuit unit 214, and transmitted to the previous, i.e. (N−1)th, second circuit unit 214 to release the accumulated charges of the previous second circuit unit 214.

Figure 3:
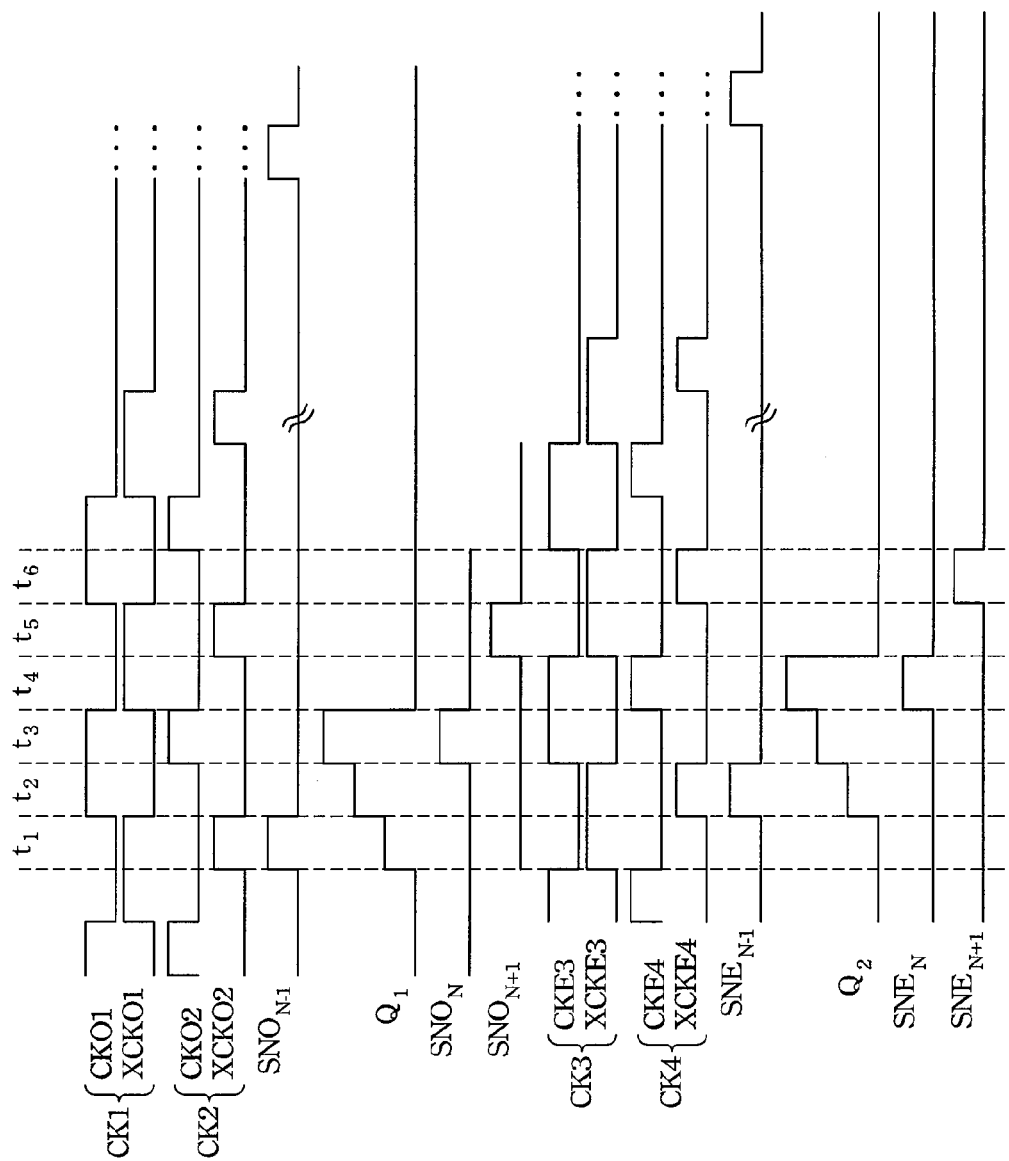
FIG. 3 shows a timing diagram of the operation of the gate driving circuit.

FIG. 3 shows a timing diagram of the operation of the gate driving circuit. For the first clock signal CK1, the phases of the first positive-phase clock signal CKO1 and the first negative-phase clock signal XCKO1 are opposite. For the second clock signal CK2, the phases of the second positive-phase clock signal CKO2 and the second negative-phase clock signal XCKO2 are opposite. Furthermore, the first clock signal CK1 and the second clock signal CK2 have a different duty cycle, and the duty cycle of the first clock signal CK1 is twice as long as the duty cycle of the second clock signal CK2. In addition, for the third clock signal CK3, the phases of the third positive-phase clock signal CKE3 and the third negative-phase clock signal XCKE3 are opposite. For the fourth clock signal CK4, the phases of the fourth positive-phase clock signal CKE4 and the fourth negative-phase clock signal XCKE4 are opposite. Furthermore, the third clock signal CK3 and the fourth clock signal CK4 have a different duty cycle, and the duty cycle of the third clock signal CK3 is twice as long as the duty cycle of the fourth clock signal CK4. Further, the first clock signal CK1 and the third clock signal CK3 have the same duty cycle and a phase shift therebetween, and the second clock signal CK2 and the fourth clock signal CK4 have the same duty cycle and a phase shift therebetween as well.

Figure 4:
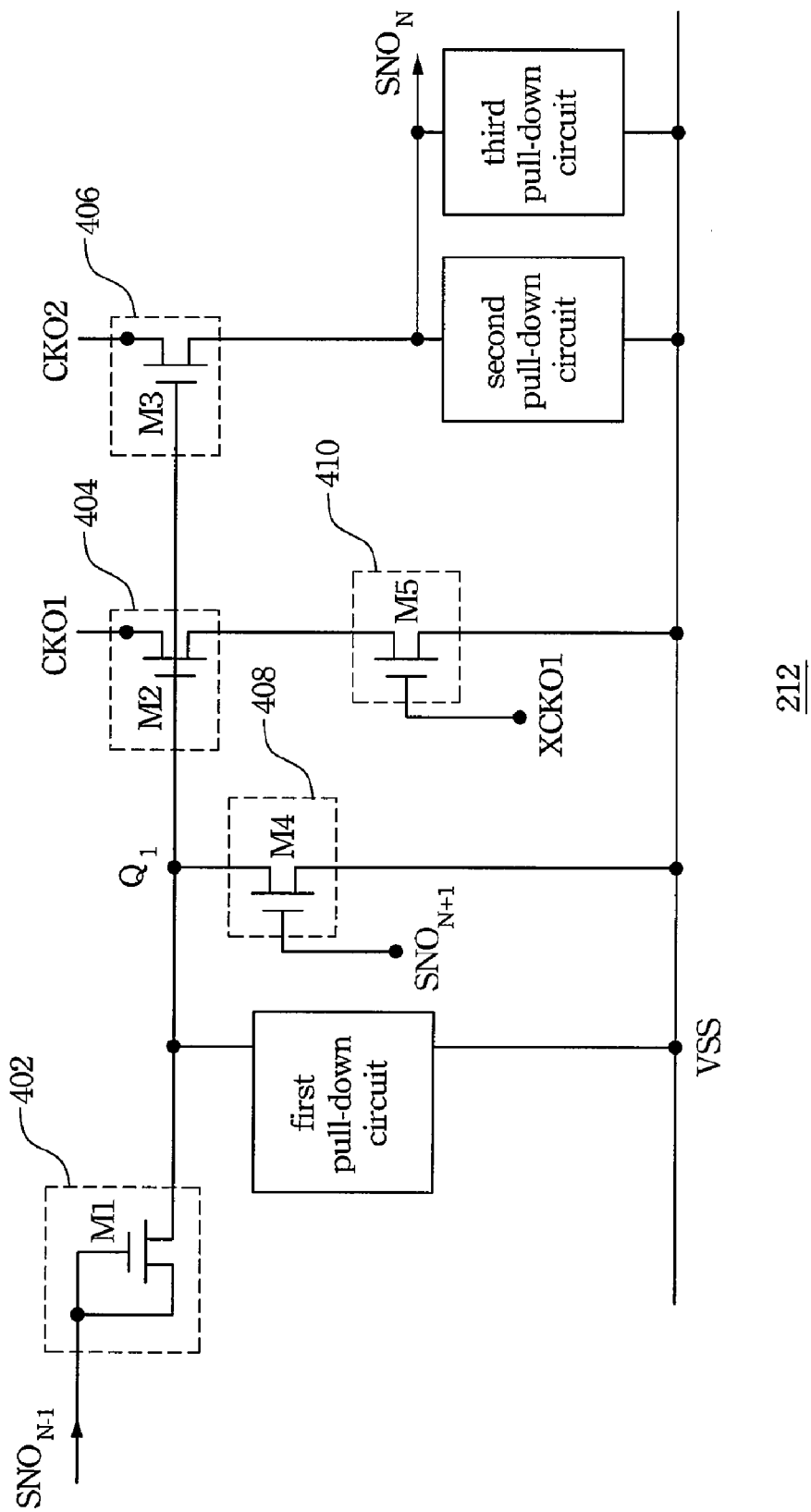
FIG. 4 shows a first circuit unit according to one embodiment of the present invention.

FIG. 4 shows a first circuit unit according to one embodiment of the present invention. Referring to FIG. 4 and taking the Nth first circuit unit for example, the first circuit unit 212 includes a first input unit 402, a first assistant output unit 404 and a first output unit 406. The first input unit 402 is coupled to an input node Q1 and receives a start signal $SNO_{N-1}$ to make the input node Q1 have a first potential, in which the start signal $SNO_{N-1}$ is the driving signal outputted from the previous first circuit unit. The first assistant output unit 404 receives the first clock signal CK1 to increase the first potential of the input node Q1. The first output unit 406 receives the second clock signal CK2 to re-increase the first potential of the input node Q1 and outputs the first driving signal $SNO_N$ as the next, i.e. (N+1)th, first start signal for the next, i.e. (N+1)th, first circuit unit 212 of the first circuit units 212. Therefore, due to the increase of the first potential of the input node Q1, the first output unit 406 can output the larger driving current, so as to drive more circuit loads.

Furthermore, for two adjacent first circuit unit 212, the first assistant output unit 404 and the first output unit 406 of one first circuit unit 212 respectively receives the first positive-phase clock signal CKO1 and the second positive-phase clock signal CKO2, and the first assistant output unit 404 and the first output unit 406 of the other first circuit unit 212 respectively receive the first negative-phase clock signal XCKO1 and the second negative-phase clock signal XCKO2. In accordance with one embodiment, if the first assistant output unit 404 and the first output unit 406 of the Nth first circuit unit 212 respectively receive the first positive-phase clock signal CKO1 and the second positive-phase clock signal CKO2, the first assistant output unit 404 and the first output unit 406 of the (N−1)th first circuit unit 212 respectively receives the first negative-phase clock signal XCKO1 and the second negative-phase clock signal XCKO2, and the first assistant output unit 404 and the first output unit 406 of the (N+1)th first circuit unit 212 respectively receives the first negative-phase clock signal XCKO1 and the second negative-phase clock signal XCKO2.

In addition, the first circuit unit 212 can further include a first control unit 408 and a first assistant pull-down unit 410. The first control unit 408 is coupled to the input node Q1 and a power voltage VSS, and receives the first driving signal $SNO_{N+1}$ outputted from the next, i.e. (N+1)th, first circuit unit 212 to release the accumulated charges of the input node Q1. The first assistant pull-down unit 410 is coupled to the first assistant output unit 404 and the power voltage VSS, and receives the first clock signal CK1 to release the accumulated charges of the input node Q1. Similarly, for two adjacent first circuit units 212, the first assistant pull-down unit 410 of one first circuit unit 212 receives the first negative-phase clock signal XCKO1, and the first assistant pull-down unit 410 of the other first circuit unit 212 receives the first positive-phase clock signal CKO1. In accordance with one embodiment, if the first assistant pull-down unit 410 of the Nth first circuit unit 212 receives the first negative-phase clock signal XCKO1, the first assistant pull-down unit 410 of the (N−1)th first circuit unit 212 and the (N+1)th first circuit unit 212 receive the first positive-phase clock signal CKO1.

In this embodiment, the first input unit 402 includes a transistor M1, in which the gate electrode and the first source/drain electrode of the transistor M1 receive the signal $SNO_{N-1}$ used as the start signal for the present, i.e. Nth, first circuit unit and the second source/drain electrode of the transistor M1 is coupled to the input node Q1. The first assistant output unit 404 includes a transistor M2, in which the gate electrode of the transistor M2 is coupled to the input node Q1 and the first source/drain electrode of the transistor M2 receives the first positive-phase clock signal CKO1 and the second source/drain electrode of the transistor M2 is coupled to the first assistant pull-down unit 410. The first output unit 406 includes a transistor M3, in which the gate electrode of the transistor M3 is coupled to the input node Q1 and the first source/drain electrode of the transistor M3 receives the sec ond positive-phase clock signal CKO2 and the second source/drain electrode of the transistor M3 outputs the present, i.e. Nth, first driving signal $SNO_N$.

Further, the first control unit 408 includes a transistor M4, in which the gate electrode of the transistor M4 receives the first driving signal $SNO_{N+1}$ outputted from the next, i.e. (N+1)th, first circuit unit and the first source/drain electrode of the transistor M4 is coupled to the input node Q1 and the second source/drain electrode of the transistor M4 is coupled to the power voltage VSS. The first assistant pull-down unit 410 includes a transistor M5, in which the gate electrode of the transistor M5 receives the first negative-phase clock signal XCKO1 and the first source/drain electrode of the transistor M5 is coupled to the second source/drain electrode of the transistor M2 and the second source/drain electrode of the transistor M5 is coupled to the power voltage VSS.

An embodiment of the operation of the first circuit unit is described herein. Referring to FIG. 3 and FIG. 4, at time t1, the first driving signal $SNO_{N-1}$ outputted from the previous, i.e. (N−1)th, first circuit unit is at a high level and is transmitted to the gate electrode and the first source/drain electrode of the transistor M1, so as to turn the transistor M1 on, and is transmitted from the first source/drain electrode to the second source/drain electrode through the transistor M1 to make the input node Q1 have the first potential.

Then at time t2, the first positive-phase clock signal CKO1 is turned from a low level to a high level and is transmitted to the first source/drain electrode of the transistor M2. Because there is a storage capacitor (not shown) between the first source/drain electrode of the transistor M2 and the input node Q1, the first positive-phase clock signal CKO1 is temporarily stored in the storage capacitor when the first positive-phase clock signal CKO1 is inputted, so as to increase accordingly the first potential of the input node Q1.

Then at time t3, the second positive-phase clock signal CKO2 is turned from a low level to a high level and is transmitted to the first source/drain electrode of the transistor M3. Because the first positive-phase clock signal CKO1 and the second positive-phase clock signal CKO2 are both at high levels and there is a storage capacitor (not shown) between the first source/drain electrode of the transistor M3 and the input node Q1 as well, the second positive-phase clock signal CKO2 is also temporarily stored in the storage capacitor when the second positive-phase clock signal CKO2 is inputted, so as to re-increase accordingly the first potential of the input node Q1. Therefore, the transistor M3 is turned on and outputs the larger driving current, so that the second positive-phase clock signal CKO2 is outputted from the transistor M3 and used to be the present, i.e. Nth, first driving signal $SNO_N$ to drive the scan line of the liquid crystal display. Further, the first driving signal $SNO_N$ is transmitted to the next, i.e. (N+1)th, first circuit unit as well to be the start signal for the next first circuit unit.

Then at time t4, the first negative-phase clock signal XCKO1 is turned from a low level to a high level and is transmitted to the gate electrode of the transistor M5, so as to turn on the transistor M5. Because there is also a storage capacitor (not shown) between the first source/drain electrode of the transistor M5 and the input node Q1, the transistor M5 can be used to release the accumulated charges of the input node Q1. In addition, there are also a storage capacitor (not shown) between the first source/drain electrode of the transistor M2 and the input node Q1 and a storage capacitor (not shown) between the first source/drain electrode of the transistor M3 and the input node Q1, so the voltage of the input node Q1 is pulled down because that the clock signals CKO1 and CKO2 are turned from a high level to a low level at time t4.

At time t5, the first driving signal $SNO_{N+1}$ outputted from the next, i.e. (N+1)th, first circuit unit is at a high level and transmitted to the gate electrode of the transistor M4 to turn the transistor M4 on, so as to release the accumulated charges of the input node Q1.

Figure 5:
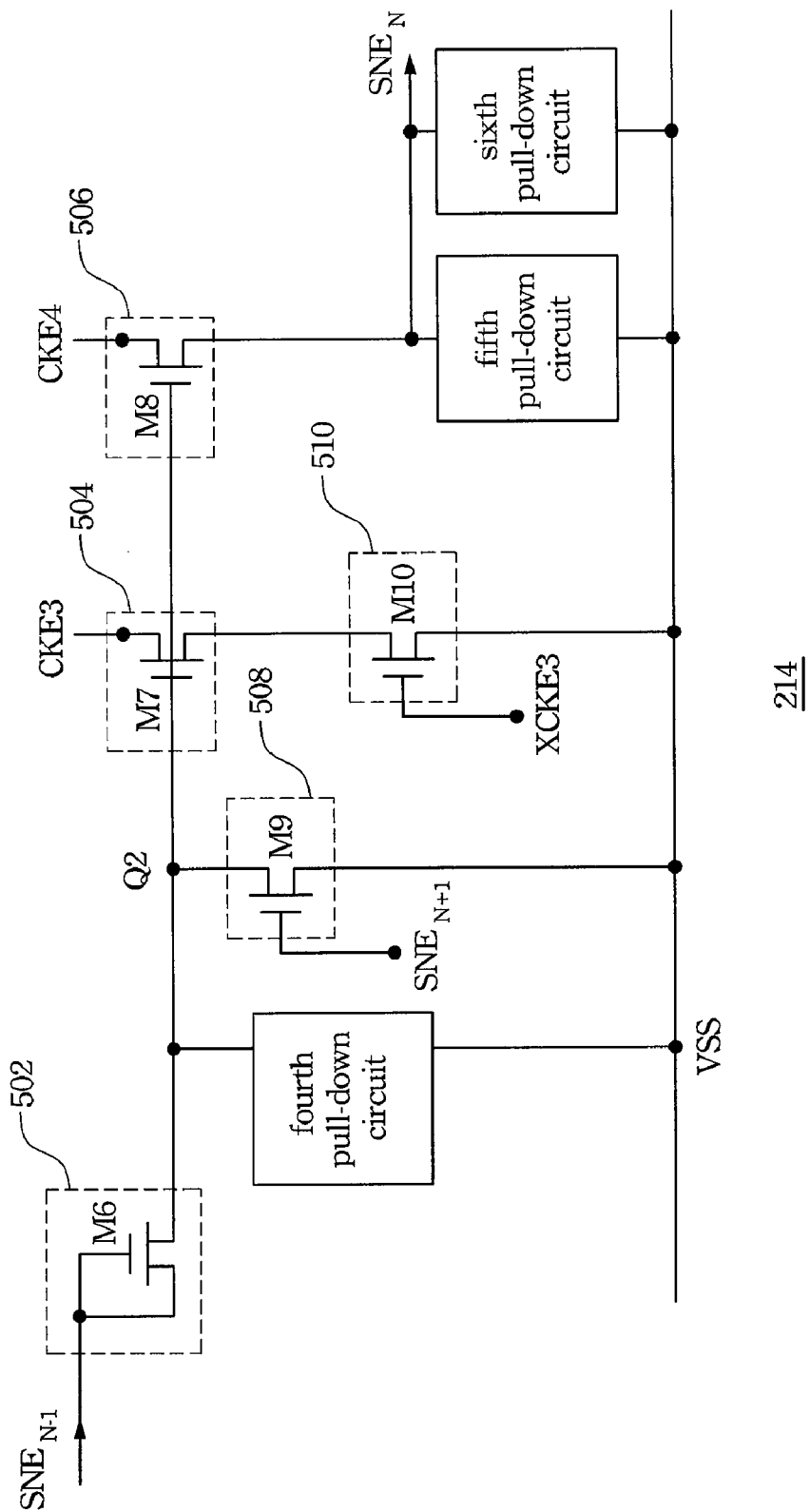
FIG. 5 shows a second circuit unit according to one embodiment of the present invention

FIG. 5 shows a second circuit unit according to one embodiment of the present invention. Referring to FIG. 5 and taking the Nth second circuit unit for example, the second circuit unit 214 includes a second input unit 502, a second assistant output unit 504 and a second output unit 506. The second input unit 502 is coupled to an input node Q2 and receives a start signal $SNE_{N-1}$ to make the input node Q2 have a second potential, in which the start signal $SNE_{N-1}$ is the driving signal outputted from the previous second circuit unit. The second assistant output unit 504 receives the third clock signal CK3 to increase the second potential of the input node Q2. The second output unit 506 receives the fourth clock signal CK4 to re-increase the second potential of the input node Q2 and outputs the second driving signal $SNE_N$ as the next, i.e. (N+1)th, second start signal for the next, i.e. (N+1)th, second circuit unit 214 of the first circuit units 212. Therefore, due to the increase of the second potential of the input node Q2, the second output unit 506 can output the larger driving current, so as to drive more circuit loads.

Furthermore, for two adjacent first circuit unit 214, the second assistant output unit 504 and the second output unit 506 of one second circuit unit 214 respectively receives the third positive-phase clock signal CKE3 and the fourth positive-phase clock signal CKE4, and the second assistant output unit 504 and the second output unit 506 of the other second circuit unit 214 respectively receives the third negative-phase clock signal XCKE3 and the fourth negative-phase clock signal XCKE4. In accordance with one embodiment, if the second assistant output unit 504 and the second output unit 506 of the Nth second circuit unit 214 respectively receive the third positive-phase clock signal CKE3 and the fourth positive-phase clock signal CKE4, the second assistant output unit 504 and the second output unit 506 of the (N−1)th second circuit unit 214 respectively receive the third negative-phase clock signal XCKE3 and the fourth negative-phase clock signal XCKE4, and the second assistant output unit 504 and the second output unit 506 of the (N+1)th second circuit unit 214 respectively receive the third negative-phase clock signal XCKE3 and the fourth negative-phase clock signal XCKE4.

In addition, the second circuit unit 214 can further include a second control unit 508 and a second assistant pull-down unit 510. The second control unit 508 is coupled to the input node Q2 and the power voltage VSS, and receives the second driving signal $SNE_{N+1}$ outputted from the next, i.e. (N+1)th, second circuit unit 214 to release the accumulated charges of the input node Q2. The second assistant pull-down unit 510 is coupled to the second assistant output unit 504 and the power voltage VSS, and receives the third clock signal CK3 to release the accumulated charges of the input node Q2. Similarly, for two adjacent second circuit units 214, the second assistant pull-down unit 510 of one second circuit unit 214 receives the third negative-phase clock signal XCKE3, and the second assistant pull-down unit 510 of the other second circuit unit 214 receives the third positive-phase clock signal CKE3. In accordance with one embodiment, if the second assistant pull-down unit 510 of the Nth second circuit unit 214 receives the third negative-phase clock signal XCKE3, the second assistant pull-down unit 510 of the (N−1)th second circuit unit 214 and the (N+1)th second circuit unit 214 receive the third positive-phase clock signal CKE3.

In this embodiment, the second input unit 502 includes a transistor M6, in which the gate electrode and the first source/ drain electrode of the transistor M6 receive the signal $SNE_{N-1}$ used as the start signal for the present, i.e. Nth, second circuit unit and the second source/drain electrode of the transistor M6 is coupled to the input node Q2. The second assistant output unit 504 includes a transistor M7, in which the gate electrode of the transistor M7 is coupled to the input node Q2 and the first source/drain electrode of the transistor M7 receives the third positive-phase clock signal CKE3 and the second source/drain electrode of the transistor M7 is coupled to the second assistant pull-down unit 510. The second output unit 506 includes a transistor M8, in which the gate electrode of the transistor M8 is coupled to the input node Q2 and the first source/drain electrode of the transistor M8 receives the fourth positive-phase clock signal CKE4 and the second source/drain electrode of the transistor M8 outputs the present, i.e. Nth, second driving signal $SNE_N$.

Further, the second control unit 508 includes a transistor M9, in which the gate electrode of the transistor M9 receives the second driving signal $SNE_{N+1}$ outputted from the next, i.e. (N+1)th, second circuit unit and the first source/drain electrode of the transistor M9 is coupled to the input node Q2 and the second source/drain electrode of the transistor M9 is coupled to the power voltage VSS. The second assistant pull-down unit 510 includes a transistor M10, in which the gate electrode of the transistor M10 receives the third negative-phase clock signal XCKE3 and the first source/drain electrode of the transistor M10 is coupled to the second source/drain electrode of the transistor M7 and the second source/drain electrode of the transistor M10 is coupled to the power voltage VSS.

An embodiment of the operation of the second circuit unit is described herein. Referring to FIG. 3 and FIG. 5, at time t2, the second driving signal $SNE_{N-1}$ outputted from the previous, i.e. (N−1)th, second circuit unit is at a high level and is transmitted to the gate electrode and the first source/drain electrode of the transistor M6, so as to turn the transistor M6 on, and is transmitted from the first source/drain electrode to the second source/drain electrode through the transistor M6 to make the input node Q2 have the second potential.

Then at time t3, the third positive-phase clock signal CKE3 is turned from a low level to a high level and is transmitted to the first source/drain electrode of the transistor M7. Because there is a storage capacitor (not shown) between the first source/drain electrode of the transistor M7 and the input node Q2, the third positive-phase clock signal CKE3 is temporarily stored in the storage capacitor when the third positive-phase clock signal CKE3 is inputted, so as to increase accordingly the second potential of the input node Q2.

Then at time t4, the fourth positive-phase clock signal CKE4 is turned from a low level to a high level and is transmitted to the first source/drain electrode of the transistor M8. Because the third positive-phase clock signal CKE3 and the fourth positive-phase clock signal CKE4 are both at high levels and there is a storage capacitor (not shown) between the first source/drain electrode of the transistor M8 and the input node Q2 as well, the fourth positive-phase clock signal CKE4 is also temporarily stored in the storage capacitor when the fourth positive-phase clock signal CKE4 is inputted, so as to re-increase accordingly the second potential of the input node Q2. Therefore, the transistor M8 is turned on and outputs the larger driving current, so that the fourth positive-phase clock signal CKE4 is outputted from the transistor M8 and used to be the present, i.e. Nth, second driving signal $SNE_N$ to drive the scan line of the liquid crystal display. Further, the second driving signal $SNE_N$ is transmitted to the next, i.e. (N+1)th, second circuit unit as well to be the start signal for the next second circuit unit.

Then at time t5, the third negative-phase clock signal XCKE3 is turned from a low level to a high level and is transmitted to the gate electrode of the transistor M10, so as to turn on the transistor M10. Because there is also a storage capacitor (not shown) between the first source/drain electrode of the transistor M10 and the input node Q2, the transistor M10 can be used to release the accumulated charges of the input node Q2. In addition, there are also a storage capacitor (not shown) between the first source/drain electrode of the transistor M7 and the input node Q2 and a storage capacitor (not shown) between the first source/drain electrode of the transistor M8 and the input node Q2, so the voltage of the input node Q2 is pulled down because that the clock signals CKE3 and CKE4 are turned from a high level to a low level at time t5.

At time t6, the second driving signal $SNE_{N+1}$ outputted from the next, i.e. (N+1)th, second circuit unit is at a high level and transmitted to the gate electrode of the transistor M9 to turn the transistor M9 on, so as to release the accumulated charges of the input node Q2.

Furthermore, the foregoing gate driving circuit according to the embodiments of the present invention can also be fabricated on a glass substrate to reduce production costs. Therefore, the production costs of the added gate driving circuit can be saved to reduce the production costs of the liquid crystal display panel.

For the foregoing embodiments of the present invention, the gate driving circuit and the driving circuit unit thereof can be used to improve the outputted driving signals and output the enough driving current and solve the problem of the heat effect of the circuit.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A gate driving circuit for driving a plurality of scan lines of a liquid crystal display, comprising:
   a plurality of first circuit units for outputting a plurality of first driving signals to the odd-numbered scan lines, wherein each of the first circuit units comprises:
      a first input unit coupled to a first input node and receiving a first start signal to make the first input node have a first potential;
      a first assistant output unit for receiving a first clock signal to increase the first potential of the first input node; and
      a first output unit for receiving a second clock signal to increase the first potential of the first input node and outputting the first driving signal as a next first start signal for a next first circuit unit of the first circuit units;
   and
   a plurality of second circuit units for outputting a plurality of second driving signals to the even-numbered scan lines, wherein each of the second circuit units comprises:
      a second input unit coupled to a second input node and receiving a second start signal to make the second input node have a second potential;
      a second assistant output unit for receiving a third clock signal to increase the second potential of the second input node; and a second output unit for receiving a fourth clock signal to increase the second potential of the second input node and outputting the second driving signal as a next second start signal for a next second circuit unit of the second circuit units.

2. The gate driving circuit as claimed in claim 1, wherein the first clock signal further comprises a first positive-phase clock signal and a first negative-phase clock signal, and the second clock signal further comprises a second positive-phase clock signal and a second negative-phase clock signal.

3. The gate driving circuit as claimed in claim 2, wherein phases of the first positive-phase clock signal and the first negative-phase clock signal are opposite, and phases of the second positive-phase clock signal and the second negative-phase clock signal are opposite.

4. The gate driving circuit as claimed in claim 2, wherein the first assistant output unit and the first output unit of one of two adjacent first circuit units receives the first positive-phase clock signal and the second positive-phase clock signal respectively, and the first assistant output unit and the first output unit of the other of two adjacent first circuit units receives the first negative-phase clock signal and the second negative-phase clock signal respectively.

5. The gate driving circuit as claimed in claim 1, wherein the first clock signal and the second clock signal have a different duty cycle.

6. The gate driving circuit as claimed in claim 1, wherein the third clock signal further comprises a third positive-phase clock signal and a third negative-phase clock signal, and the fourth clock signal further comprises a fourth positive-phase clock signal and a fourth negative-phase clock signal.

7. The gate driving circuit as claimed in claim 6, wherein phases of the third positive-phase clock signal and the third negative-phase clock signal are negative, and phases of the fourth positive-phase clock signal and the fourth negative-phase clock signal are negative.

8. The gate driving circuit as claimed in claim 6, wherein the second assistant output unit and the second output unit of one of two adjacent second circuit units receives the third positive-phase clock signal and the fourth positive-phase clock signal respectively, and the second assistant output unit and the second output unit of the other of two adjacent second circuit units receives the third negative-phase clock signal and the fourth negative-phase clock signal respectively.

9. The gate driving circuit as claimed in claim 1, wherein the third clock signal and the fourth clock signal have a different duty cycle.

10. The gate driving circuit as claimed in claim 1, wherein the first clock signal and the third clock signal have the same duty cycle and a phase shift therebetween.

11. The gate driving circuit as claimed in claim 1, wherein the second clock signal and the fourth clock signal have the same duty cycle and a phase shift therebetween.

12. The gate driving circuit as claimed in claim 1, wherein the first input unit comprises:
a first transistor having a gate electrode, a first electrode and a second electrode, wherein the gate electrode and the first electrode are coupled to each other and receive the first start signal, and the second electrode is coupled to the first input node.

13. The gate driving circuit as claimed in claim 1, wherein the first assistant output unit comprises:
a second transistor having a gate electrode and a first electrode, wherein the gate electrode is coupled to the first input node, and the first electrode receives the first clock signal.

14. The gate driving circuit as claimed in claim 1, wherein the first output unit comprises:
a third transistor having a gate electrode, a first electrode and a second electrode, wherein the gate electrode is coupled to the first input node, and the first electrode receives the second clock signal, and the second electrode outputs the first driving signal.

15. The gate driving circuit as claimed in claim 1, wherein each of the first circuit units further comprises:
a first control unit coupled to the first input node and a power voltage and receiving a next first driving signal outputted from the next first circuit unit to release accumulated charges of the first input node.

16. The gate driving circuit as claimed in claim 15, wherein the first control unit comprises:
a fourth transistor having a gate electrode, a first electrode and a second electrode, wherein the gate electrode receives the next first driving signal, and the first electrode is coupled to the first input node, and the second electrode is coupled to the power voltage.

17. The gate driving circuit as claimed in claim 1, wherein each of the first circuit units further comprises:
a first assistant pull-down unit coupled to the first assistant output unit and a power voltage and receiving the first clock signal to release accumulated charges of the first input node.

18. The gate driving circuit as claimed in claim 17, wherein the first assistant pull-down unit comprises:
a fifth transistor having a gate electrode, a first electrode and a second electrode, wherein the gate electrode receives the first clock signal, and the first electrode is coupled to the first assistant output unit, and the second electrode is coupled to the power voltage.

19. The gate driving circuit as claimed in claim 1, wherein the second input unit comprises:
a sixth transistor having a gate electrode, a first electrode and a second electrode, wherein the gate electrode and the first electrode receive the second start signal, and the second electrode is coupled to the second input node.

20. The gate driving circuit as claimed in claim 1, wherein the second assistant output unit comprises:
a seventh transistor having a gate electrode and a first electrode, wherein the gate electrode of is coupled to the second input node, and the first electrode receives the third clock signal.

21. The gate driving circuit as claimed in claim 1, wherein the second output unit comprises:
an eighth transistor having a gate electrode, a first electrode and a second electrode, wherein the gate electrode is coupled to the second input node, and the first electrode receives the fourth clock signal, and the second electrode outputs the second driving signal.

22. The gate driving circuit as claimed in claim 1, wherein each of the second circuit units further comprises:
a second control unit coupled to the second input node and a power voltage and receiving a next second driving signal outputted from the next second circuit unit to release accumulated charges of the second input node.

23. The gate driving circuit as claimed in claim 22, wherein the second control unit comprises:
a ninth transistor having a gate electrode, a first electrode and a second electrode, wherein the gate electrode receives the next second driving signal outputted from the next second circuit unit, and the first electrode is coupled to the second input node, and the second electrode is coupled to the power voltage.

24. The gate driving circuit as claimed in claim 1, wherein each of the second circuit units further comprises:
- a second assistant pull-down unit coupled to the second assistant output unit and a power voltage and receiving the third clock signal to release accumulated charges of the second input node.

25. The gate driving circuit as claimed in claim 24, wherein the second assistant pull-down unit comprises:
- a tenth transistor having a gate electrode, a first electrode and a second electrode, wherein the gate electrode receives the third clock signal, and the first electrode is coupled to the second assistant output unit, and the second electrode is coupled to the power voltage.

26. The gate driving circuit as claimed in claim 1, wherein the gate driving circuit is fabricated on a glass substrate.

27. A driving circuit unit configured in a gate driving circuit driving a plurality of scan lines of a liquid crystal display, the driving circuit unit configured for outputting a driving signal to drive one of the scan lines, the driving circuit unit comprising:
- an input unit coupled to an input node, configured to receive and activated by the driving signal from a previous driving circuit unit such that the input node has a potential;
- an assistant output unit coupled to the input unit at the input node, for receiving a first clock signal and activated such that the potential of the input node is increased according to the first clock signal; and
- an output unit coupled to the input unit at the input node, for receiving a second clock signal and outputting the driving signal and activated such that the increased potential of the input node is further increased according to the second clock signal.

28. The driving circuit unit as claimed in claim 27, wherein the first clock signal further comprises a first positive-phase clock signal and a first negative-phase clock signal.

29. The driving circuit unit as claimed in claim 27, wherein the second clock signal further comprises a second positive-phase clock signal and a second negative-phase clock signal.

30. The driving circuit unit as claimed in claim 27, wherein the first clock signal and the second clock signal have a different duty cycle.

31. The driving circuit unit as claimed in claim 27, wherein the input unit comprises:
- a first transistor having a gate electrode, a first electrode and a second electrode, wherein the gate electrode and the first electrode are coupled to each other and receive the start signal, and the second electrode is coupled to the input node.

32. The driving circuit unit as claimed in claim 27, wherein the assistant output unit comprises:
- a second transistor having a gate electrode and a first electrode, wherein the gate electrode is coupled to the input node, and the first electrode receives the first clock signal.

33. The driving circuit unit as claimed in claim 27, wherein the output unit comprises:
- a third transistor having a gate electrode, a first electrode and a second electrode, wherein the gate electrode is coupled to the input node, and the first electrode receives the second clock signal, and the second electrode outputs the driving signal.

34. The driving circuit unit as claimed in claim 27, further comprising an assistant pull-down unit coupled to the assistant output unit and a power voltage and receiving the first clock signal to release accumulated charges of the input node.

35. The driving circuit unit as claimed in claim 34, wherein the assistant pull-down unit comprising:
- a fourth transistor having a gate electrode, a first electrode and a second electrode, wherein the gate electrode receives the first clock signal, and the first electrode is coupled to the assistant output unit, and the second electrode is coupled to the power voltage.

\* \* \* \* \*